(12) United States Patent
Maeda et al.

(10) Patent No.: US 8,951,385 B2
(45) Date of Patent: Feb. 10, 2015

(54) PLASMA PROCESSING APPARATUS AND PLASMA PROCESSING METHOD

(71) Applicant: Hitachi High-Technologies Corporation, Minato-ku, Tokyo (JP)

(72) Inventors: Kenji Maeda, Kodaira (JP); Ken Yoshioka, Hikari (JP); Hiromichi Kawasaki, Shunan (JP); Takahiro Shimomura, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/864,317

(22) Filed: Apr. 17, 2013

(65) Prior Publication Data

US 2013/0267098 A1 Oct. 10, 2013

(51) Int. Cl.
*H01L 21/306* (2006.01)
*H01L 21/67* (2006.01)
*H01L 21/02* (2006.01)
*C23C 16/507* (2006.01)
*H01J 37/32* (2006.01)

(52) U.S. Cl.
CPC .... *H01L 21/67017* (2013.01); *H01L 21/67069* (2013.01); *H01L 21/67034* (2013.01); *H01L 21/02041* (2013.01); *H01L 21/02104* (2013.01); *H01L 21/02* (2013.01); *C23C 16/507* (2013.01); *H01J 37/321* (2013.01); *H01J 37/3211* (2013.01); *H01J 37/32174* (2013.01); *H01J 37/32183* (2013.01)
USPC ................. 156/345.44; 156/345.48; 438/710; 438/758; 118/723 I

(58) Field of Classification Search
USPC ...... 156/345.44, 345.48; 118/723 I; 438/710, 438/758
See application file for complete search history.

(56) References Cited

U.S. PATENT DOCUMENTS

| | | | |
|---|---|---|---|
| 5,965,034 A | 10/1999 | Vinogradov et al. | |
| 6,353,206 B1 * | 3/2002 | Roderick | 219/121.52 |
| 2002/0041160 A1 * | 4/2002 | Barnes et al. | 315/111.21 |
| 2006/0124059 A1 * | 6/2006 | Kim et al. | 118/723.001 |
| 2009/0095714 A1 * | 4/2009 | Chen et al. | 216/67 |
| 2009/0289179 A1 * | 11/2009 | Chen et al. | 250/251 |
| 2010/0059692 A1 * | 3/2010 | Quick, II | 250/492.1 |
| 2010/0243162 A1 * | 9/2010 | Koshimizu | 156/345.28 |
| 2010/0263796 A1 * | 10/2010 | Edamura et al. | 156/345.37 |
| 2012/0073756 A1 * | 3/2012 | Yamazawa | 156/345.48 |
| 2012/0074100 A1 * | 3/2012 | Yamazawa | 216/68 |

FOREIGN PATENT DOCUMENTS

| | | |
|---|---|---|
| JP | 2000-49000 | 2/2000 |
| JP | 2000-501568 | 2/2000 |
| JP | 2003-37101 | 2/2003 |

* cited by examiner

*Primary Examiner* — Binh X Tran
(74) *Attorney, Agent, or Firm* — Antonelli, Terry, Stout & Kraus, LLP.

(57) ABSTRACT

A plasma processing apparatus is offered which has evacuable vacuum vessel, processing chamber disposed inside the vacuum vessel and having inside space in which plasma for processing sample to be processed is generated and in which the sample is placed, unit for supplying gas for plasma generation into processing chamber, vacuum evacuation unit for evacuating inside of processing chamber, helical resonator configured of helical resonance coil disposed outside the vacuum vessel and electrically grounded shield disposed outside the coil, RF power supply of variable frequency for supplying RF electric power in given range to the resonance coil, and frequency matching device capable of adjusting frequency of the RF power supply so as to minimize reflected RF power. The resonance coil has electrical length that is set to integral multiple of one wavelength at given frequency. The helical resonance coil has feeding point connected to ground potential using variable capacitive device.

3 Claims, 8 Drawing Sheets

FIG.2A

ELECTRIC DISCHARGE PRESSURE (Pa)

UNIT: W

| ELECTRIC DISCHARGE POWER (W) | 100Pa | 150Pa | 200Pa | 250Pa | 300Pa | 400Pa | 533Pa |
|---|---|---|---|---|---|---|---|
| 1000W | 0 | 0 | 0 | 0 | 0 | 0 | 0 |
| 1500W | 0 | 0 | 0 | 0 | 0 | 0 | 0 |
| 2000W | 0 | 0 | 0 | 0 | 0 | 0 | 0 |
| 2500W | 0 | 0 | 0 | 0 | 0 | 0 | 0 |
| 3000W | 0 | 0 | 0 | 0 | 0 | 0 | 0 |
| 4000W | 0 | 0 | 0 | 0 | 0 | 0 | 0 |
| 4500W | 0 | 0 | 0 | 0 | 0 | 0 | 0 |

FIG.2B

ELECTRIC DISCHARGE PRESSURE (Pa)

UNIT: pF

| ELECTRIC DISCHARGE POWER (W) | 100Pa | 150Pa | 200Pa | 250Pa | 300Pa | 400Pa | 533Pa |
|---|---|---|---|---|---|---|---|
| 1000W | 20 | 70 | 90 | 105 | 120 | 140 | 130 |
| 1500W | 35 | 20 | 40 | 60 | 75 | 100 | 120 |
| 2000W | 60 | 50 | 35 | 30 | 45 | 70 | 90 |
| 2500W | 75 | 70 | 60 | 40 | 30 | 50 | 70 |
| 3000W | 75 | 80 | 75 | 70 | 55 | 30 | 55 |
| 4000W | 85 | 80 | 80 | 85 | 85 | 75 | 40 |
| 4500W | 85 | 80 | 85 | 85 | 90 | 85 | 68 |

ELECTRIC DISCHARGE PRESSURE (Pa)

UNIT: W

| | 100Pa | 150Pa | 200Pa | 250Pa | 300Pa | 400Pa | 533Pa |
|---|---|---|---|---|---|---|---|
| 1000W | 0 | 0 | 40 | 100 | 200 | 190 | 150 |
| 1500W | 0 | 20 | 0 | 0 | 0 | 60 | 180 |
| 2000W | 0 | 20 | 10 | 0 | 0 | 80 | 10 |
| 2500W | 0 | 0 | 10 | 30 | 0 | 0 | 20 |
| 3000W | 20 | 20 | 20 | 0 | 0 | 30 | 0 |
| 4000W | 60 | 50 | 50 | 50 | 50 | 20 | 30 |
| 4500W | 80 | 80 | 60 | 70 | 70 | 60 | 0 |

ELECTRIC DISCHARGE POWER (W)

PLASMA PROCESSING APPARATUS AND PLASMA PROCESSING METHOD

BACKGROUND OF THE INVENTION

The present invention relates to a plasma processing apparatus and plasma processing method for processing a sample in the form of a substrate such as a semiconductor wafer placed in a processing chamber formed within a vacuum vessel by the use of a plasma generated in the processing chamber and, more particularly, to an inductively coupled plasma processing apparatus and processing method capable of exciting a plasma at a quite low potential adapted for processing such as etching, ashing, CVD (chemical vapor deposition) using a helical coil resonating in a fill wavelength mode.

In processes for mass producing semiconductor devices, plasma processing such as plasma etching, plasma CVD, and plasma ashing has enjoyed wide acceptance. Plasma processing is carried out by generating a plasma by applying RF electric power or microwave electric power to a process gas under an evacuated state and directing a stream of ions or radicals at a wafer. Semiconductor devices will continue to be fabricated with still reduced dimensions. According to the International Technology Roadmap for Semiconductors (ITRS), it is expected that devices having half pitches equal to or less than 20 nm will begin to be mass produced between 2014 and 2016. It is expected that the main transistor structure adopted at this time will the FinFET type of 3D structure such as double gate type and trigate type rather than the planar type (flat surface type) of the current mainstream. Plasma processing apparatuses and equipment used for manufacturing of these future semiconductor devices are required to have finer processing performance, lower damage, selectivity, controllability, and stability. Especially, as device dimensions decrease further, damage caused by a plasma during the processing will become more serious.

There are some types of damage caused by plasmas. It is known that as the plasma potential rises, various harmful effects are produced. For example, in an ashing process carried out by introducing a gas such as $O_2$ from the top of a plasma reactor and causing O radicals generated by a plasma to react with a resist lying on a wafer placed in a downstream region, the wafer is normally mounted on a wafer stage at ground potential. Therefore, where the plasma potential is high, a potential difference is created relative to the wafer. Positive ions within the plasma are accelerated and enter the wafer. As a result, the underlying film may be damaged or peeled off. Furthermore, depending on high plasma potentials, a plasma may be generated in inherently undesired locations, e.g., beside or below the stage. Accordingly, the plasma potential needs to be controlled to low values substantially close to the ground potential.

One example of the prior art capable of achieving low-damage processing by suppressing the plasma potential is a technique disclosed in JP-A-2000-501568 (corresponding to U.S. Pat. No. 5,965,034), where a helical resonator is applied to plasma generation. In the present technique, electrical current and voltage standing waves are excited by helical coils resonating in a full wavelength mode. The phase voltage of the voltage standing waves and the reverse-phase voltage are made to cancel each other. At the point at which the phase voltage is switched, i.e., at a node where the potential is substantially zero, a plasma at a quite low potential can be excited by induction coupling owing to electrical current standing wave. Consequently, capacitive coupling between a voltage induced in a coil and a plasma can be prevented; in the conventional inductively coupled plasma source, it would have been difficult to avoid such capacitive coupling. Hence, increases in the plasma potential can be suppressed.

Furthermore, JP-A-2000-49000 discloses a technique in which a frequency matching device is employed in a plasma processing apparatus using the aforementioned helical resonator. In this technique, electric power reflected from a plasma load or the phase difference between voltage and current is monitored, and reflection from the load is automatically suppressed by providing feedback control of the oscillation frequency from a power supply such that the reflected electric power is reduced or the phase difference between the voltage and current is reduced down to zero.

In addition, JP-A-2003-37101 discloses a technique in which a load impedance is made to correspond to some different types of processing conditions by switching the ground point of a resonance coil by the use of a vacuum relay in a plasma processing apparatus that uses the above-described helical resonator and frequency matching device.

SUMMARY OF THE INVENTION

In the plasma processing apparatus (JP-A-2000-49000) using the aforementioned helical resonator and frequency matching device, in a case where only one certain type of processing is used, the requirement is only that the resonant characteristics are adjusted in advance according to the condition. This adjustment is carried out by a human operator by manually modifying the position of the ground point of the helical resonator and the position of a feeding point. FIG. 7A shows traveling wave electric power (Pf) and reflected wave electric power (Pr) in a case where the frequency of an RF power supply was varied in a helical resonator in which the position of the feeding point and the position of the ground point were appropriately adjusted. When the present data was collected empirically, the oscillation frequency of the RF power supply was manually set. The frequency was varied successively from the higher frequency side (27.7 MHz) to the lower frequency side (26.6 MHz). It can be seen from this figure that Pr is nearly close to 0 W in the neighborhood of frequency 27.1 MHz On the other hand, Pf and Pr in a case where the positions of the feeding point and ground point were inappropriate are shown in FIG. 7B. In this case, it is seen that reflected wave of about 200 W remains even at frequency 27.15 MHz The frequency matching device has a function of automatically varying the frequency so as to minimize Pr. Under the circumstances shown in FIG. 7B, i.e., the positions of the feeding point and the ground point are not appropriate, it has been impossible to adjust the reflected wave to 0 W using the frequency matching device alone. Accordingly, even if the power feeding point and the ground point are adjusted optimally for certain one condition, reflected power will be left when the plasma processing conditions are varied to thereby vary the load impedance.

FIG. 8 shows a map (matrix) of reflected waves obtained under conditions where the electric discharge power and the pressure were varied in a hardware system in which the power feeding point was so adjusted that the reflected power Pr became equal to 0 W under reference conditions (high pressure/high power) where the $O_2$ gas flow rate was 10 L/min, the pressure was 533 Pa, and the electric discharge power was 4500 W. It can be seen from FIG. 8 that reflected power emerges from a region that covers 50% of the map or more and that the value of the reflected wave increased further under conditions where the plasma impedance varies greatly from the reference conditions such as conditions of 533 Pa and 100 W and conditions of 100 Pa and 4500 W. It is now assumed that one wants to use the conditions of 533 Pa and 1000 W. The operator needs to modify or adjust the ground point and feeding point. However, there is the problem that after the adjustment of the ground point and feeding point, the reflected wave increases conversely under the reference conditions of 533 Pa and 4500 W.

In the technique set forth in the above-cited JP-A-2003-37101, the ground point of the resonance coil can be switched using the vacuum relay and, therefore, it is possible to cope with two or three types of conditions rather than a single condition. For instance, in the above-referenced FIG. 8, it is possible to cope with two sets of conditions: conditions of 533 Pa and 4500 W and conditions of 533 Pa and 1000 W. However, as can be seen from the principle, with the present technique, only stepwise adjustments are allowed. Accordingly, with these conventional techniques, it is difficult to cope with processing of Fin FET devices having a 3D structure that will be the mainstream in the future, because it will be necessary to cope with more steps in order to process complex structures, and because plural processing steps under different conditions need to be carried out in succession to process a laminate film structure configured of plural types in bulk. In the technique set forth in JP-A-2003-37101, if reflected electric power can be suppressed by two or three steps, it would be difficult to cope with a greater number of steps. Furthermore, it would be difficult to avoid the drawback that reflected electric power places restraints on process development.

It is an object of the present invention to provide a plasma processing apparatus or plasma processing method capable of suppressing reflected waves under various conditions by the use of a helical resonator that can excite a plasma at a quite low potential advantageous for low-damage processing without modifying the feeding point or the ground point.

In order to suppress reflected electric power, i.e., to introduce RF electric power efficiently to a load, it is necessary to match the characteristic impedance (50+0 j ($\Omega$)) of the power supply and the transmission system to the complex impedance $Z=R+Xj$ ($\Omega$) of the load (helical resonator+plasma). That is, it is necessary to adjust the two variables of the real part R and the imaginary part X of the load impedance. Accordingly, by adjustments with one degree of freedom offered by frequency matching as set forth in JP-A-2000-49000 and JP-A-2003-37101, matching is achieved only under severely limited conditions. Some or other adjustment unit with another degree of freedom needs to be incorporated. As a result of various discussions, the inventors of the present application have found that the simplest and most efficient way of achieving this adjustment unit is to insert a variable capacitive device in parallel with a helical antenna and with ground and in close proximity to the feeding point.

The above-described object is achieved by a plasma processing apparatus having an evacuable vacuum vessel, a unit for supplying a gas for plasma generation, a vacuum evacuation unit, a helical resonator configured of a helical resonance coil disposed outside the vacuum vessel and an electrically grounded shield disposed outside the coil, an RF power supply of a variable frequency for supplying RF electric power in a given range to the resonance coil, and a frequency matching device capable of adjusting the frequency of the RF power supply so as to minimize reflected RF electric power. The electrical length of the resonance coil is set to an integral multiple of one wavelength at the given frequency. The helical resonance coil has a feeding point that is connected to ground potential via a variable capacitive device.

The above-described object is also achieved by a plasma processing method for processing a sample by placing the sample to be processed in a processing chamber disposed inside an evacuable vacuum vessel, supplying a gas for plasma generation into the processing chamber, supplying RF electric power of a given frequency to a helical coil disposed outside the vacuum vessel to thereby form an electric field, and supplying the electric field into the processing chamber to generate a plasma inside the processing chamber using the gas. The electrical length of the helical coil is set to an integral multiple of one wavelength of the given frequency. The capacitance of a variable capacitive device coupled to the feeding point of the helical coil.

Other objects, features, and advantages of the present invention will become apparent from the following description of embodiments of the invention taken in connection with the accompanying drawings.

BRIEF DESCRIPTION OF THE DRAWINGS

FIG. 2A is a map indicative of reflected waves produced when electric discharge pressure and electric discharge power are varied.

FIG. 2B is a map indicative of the values of a variable capacitive device assumed when electric discharge pressure and electric discharge power are varied.

DETAILED DESCRIPTION OF THE EMBODIMENTS

Modes of practice of the present invention are hereinafter described.

Embodiments

Embodiments of the present invention are hereinafter described with reference to the drawings.

Figure 1:
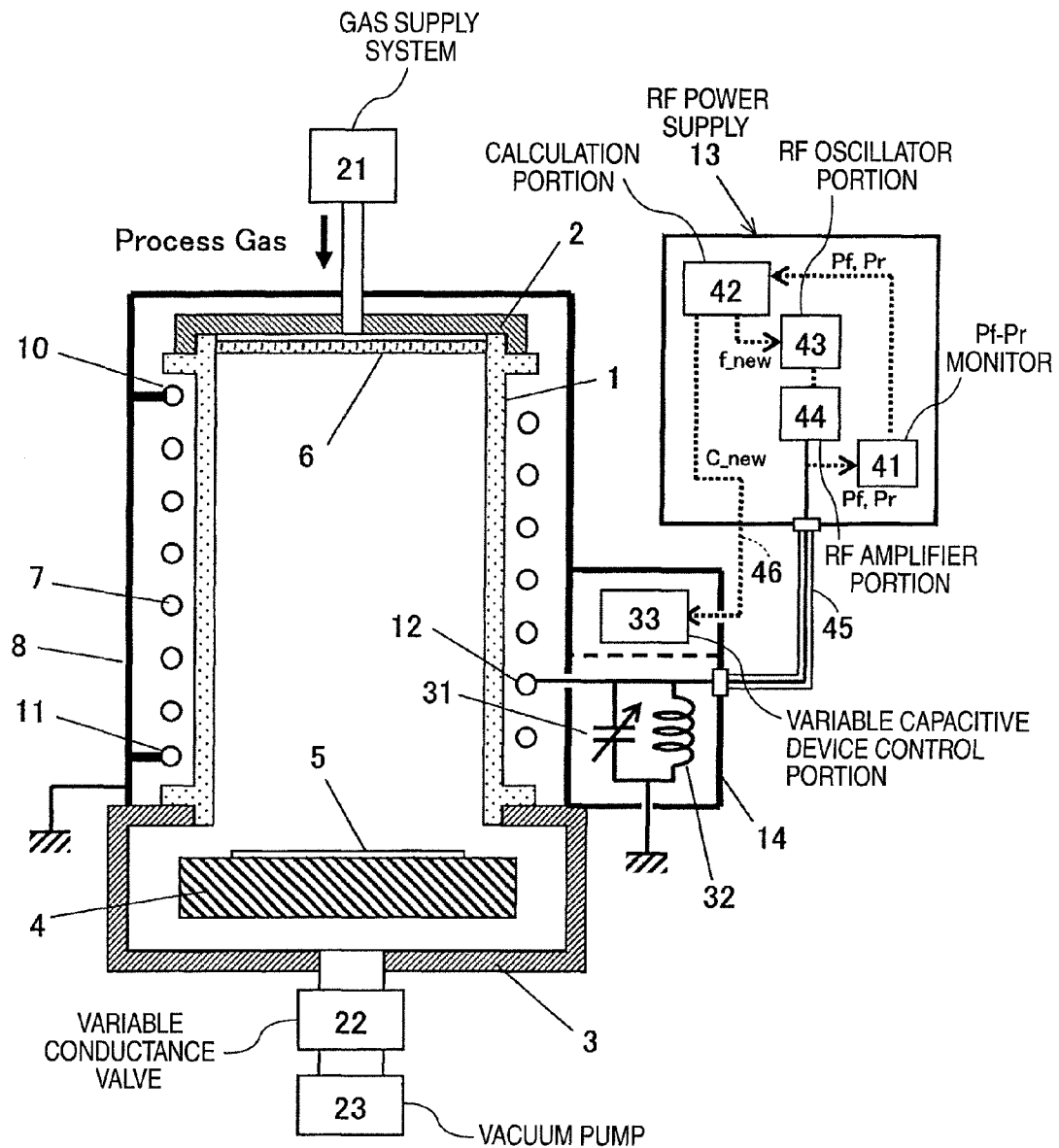
FIG. 1 is a vertical cross section schematically showing a plasma processing apparatus associated with an embodiment of the present invention.

FIG. 1 schematically shows the configuration of a plasma processing apparatus associated with an embodiment of the present invention. A metallic top cover 2 is mounted at the top of a substantially cylindrical dielectric container 1. A metallic processing chamber 3 is mounted in a lower portion.

The dielectric container 1, top cover 2, and processing chamber 3 are configured together with vacuum seal units such as O-rings to form an airtight structure. The apparatus is evacuated by a vacuum pump 23 connected via a variable conductance valve 22. The top cover 2 is equipped with a gas supply system 21. A process gas is regulated into a desired pattern of flow by a gas regulation unit 6 equipped in a lower part of the top cover 2 and then introduced into the processing chamber. A wafer stage 4 for mounting a wafer 5 (a medium to be processed) is equipped in the processing chamber.

A helical antenna (helical resonance coil) 7 and a grounded metallic shield 8 are mounted on the outside of the dielectric container 1. The output of an RF power supply 13 is connected to a feeding point 12. The electrical length of the antenna 7 is a length corresponding to one wavelength at the frequency of the RF power supply 13. The both ends are grounded by an upper ground point 10 and a lower ground point 11.

That is, the helical antenna 7 and the shield 8 together constitute a helical resonator. A feed line in close proximity to the aforementioned feeding point is connected to ground potential by a variable capacitive device 31. A stationary inductive device 32 may be connected in parallel with the variable capacitive device 31. A plasma and radicals are generated by introducing a desired gas by the gas supply system 21 and feeding RF electric power to the helical antenna 7. Plasma processing is performed by directing these at the wafer 5.

Preferably, the substantially cylindrical dielectric container 1 is made of a material which well withstands plasmas, has a small dielectric loss, and is less likely to produce foreign matter and contamination, i.e., fused quartz, sintered alumina of high purity, or sintered yttria. Preferably, to process the wafer 5 uniformly, the inside diameter Dq of the dielectric container 1 is set based on the diameter Dw of the wafer such that 0.6 Dw<Dq<1.4 Dw, for the following reasons.

Where the inside diameter of the dielectric container is too small, the processing rate in the center of the wafer rises. Conversely, where the diameter is too large, the processing rate at the peripheral regions of the wafer rises. In order to process the wafer 5 uniformly, the height H of the dielectric container 1 is preferably set based on the diameter Dw of the wafer such that 0.8 Dw<H<4.0 Dw.

The metallic processing chamber 3 is equipped in a lower portion of the dielectric container 1. Preferably, the processing chamber 3 is made of a material which well withstands plasmas and is less likely to contaminate the wafer with heavy metals or to contaminate the wafer with foreign matter, i.e., aluminum whose surface is alumite-treated.

Alternatively, a material such as yttria, alumina, silicon oxide, or other material is thermally sprayed onto the basic material of aluminum. The variable conductance valve 22 and the vacuum pump 23 are provided in the processing chamber 3. The processing chamber 3 has a function of maintaining constant the pressure inside the processing chamber by controlling the variable conductance valve while a desired flow rate of process gas is flowing from the gas supply system 21.

The wafer stage 4 for mounting the wafer 5 thereon is mounted inside the processing chamber 3 and below the dielectric container 1. Preferably, the wafer stage is made of a material that is aluminum or titanium alloy whose surface is alumited. The stage has a heater (not shown) or a chiller and is configured to provide temperature adjustment from about 20° C. to about 400° C. Furthermore, there is a lift pin (not shown) for moving the wafer up and down.

The top cover 2 made of aluminum whose surface has been alumited is mounted at the top of the substantially cylindrical dielectric container 1, and is connected to the dielectric container 1 so as to maintain the airtight state by a vacuum seal unit such as an O-ring. During discharging, the top cover 2 and dielectric container 1 are elevated in temperature. The top cover 2 is cooled by a refrigerant with the purpose of preventing thermal deterioration of the O-ring. The gas supply system 21 is connected to the top cover 2 such that a desired type of mixture gas can be supplied.

The nearly circular regulation unit 6 is mounted in a lower portion of the top cover 2. Preferably, the gas regulation unit 6 is made of a material that is highly resistant to plasmas, has a small dielectric loss, and is less likely to produce foreign matter and contamination, i.e., fused quartz, sintered alumina of high purity, or sintered yttria. An appropriate shape is selected as the regulation unit in order to vary the format in which gas is supplied into the dielectric container 1. If the regulation unit is a substantially disklike shower plate, gas can be supplied nearly uniformly.

On the other hand, where one wants to shape the regulation unit 6 into a disk whose outer contour is smaller than the inside diameter of the dielectric container 1 by approximately 1 mm to 10 mm, gas can be supplied from around the outer periphery of the dielectric container 1. An appropriate gas type is selected according to the film species to be processed by ashing. Taking ashing processing, for example, for peeling various organic films as an example, $O_2$, $N_2$, $H_2$, He, $CF_4$, $CO_2$, and mixture gases thereof are often used.

The antenna 7 made of a helically shaped, metallic pipe having a diameter of 5 mm to 20 mm is mounted on the outside of the dielectric container 1. The length of the antenna is equivalent to substantially one wavelength of the used wavelength. For example, where a frequency of 27.12 MHz is used, the antenna length is about 11 m.

A temperature adjusted refrigerant is made to flow through the antenna with the object of suppressing temperature rises of the antenna itself when RF electric power is supplied. The both ends of the antenna are connected with the shield 8 at ground potential, through the upper ground point 10 and lower ground point 11. The antenna and shield are made of copper that is a general material having a small electrical resistance value. In addition, the surface of the copper may be plated with silver or gold with the purpose of improving the high-frequency characteristics.

The helical antenna 7 substantially equivalent to one wavelength and the shield 8 cooperate to constitute a helical resonator. A plasma at a quite low potential can be excited by exciting an electrical current and a standing wave of voltage by a helical coil resonating in a full wavelength mode, causing the phase voltage of standing wave of voltage and the reverse-phase voltage to cancel each other, and employing inductive coupling caused by standing wave of current at the point at which the phase voltage is switched, i.e., at a node where the potential is substantially zero.

The feeding point 12 is formed at a position that is spaced from the lower ground of the antenna 7 along the antenna by a distance equivalent to about 1/200 to 1/50 of the wavelength. The output of the RF power supply 13 is coupled to this feeding point. A power line in close proximity to the feeding point is electrically connected so as to be at ground potential via the variable capacitive device 31 having a capacitance of about 5 pF to 500 pF.

The capacitance of this variable capacitive device 31 can be adjusted by a mechanical drive unit (not shown) such as a DC servomotor or stepping motor and a variable capacitive device control portion 33 controlling the mechanical drive unit. Furthermore, the stationary inductive device 32 may be connected in parallel with the variable capacitive device. Indicated by 14 is a matching device with one degree of freedom.

The frequency of the RF power supply 13 is appropriately selected between 400 kHz to 40 MHz. This time, 27.12 MHz is used. This RF power supply 13 has a function of matching frequency. That is, this RF power supply has a function of varying the output frequency within a range from ±5% to ±10% of the center frequency 27.12 MHz and providing feedback control of the frequency such that the ratio of Pr (electric power of reflected wave) to Pf (electric power of traveling wave) (Pr/Pf) monitored by the output portion of the RF power supply decreases.

The traveling wave power and reflected wave power are detected by a Pf-Pr monitor 41 and sent to a calculation portion 42 composed of a microcomputer or CPU. In the calculation portion, the frequency f_new and the static capacitance C_new are determined by a given algorithm.

In an RF oscillator portion 43, a signal of the frequency f_new is generated and amplified up to a given output by an RF amplifier portion 44. Electric power is fed to the feeding point 12 via a coaxial cable 45. The static capacitance C_new is sent to the variable capacitive device control portion 33 via a signal line 46. The value of the variable capacitive device 31 is appropriately adjusted.

Figures 8, 9:
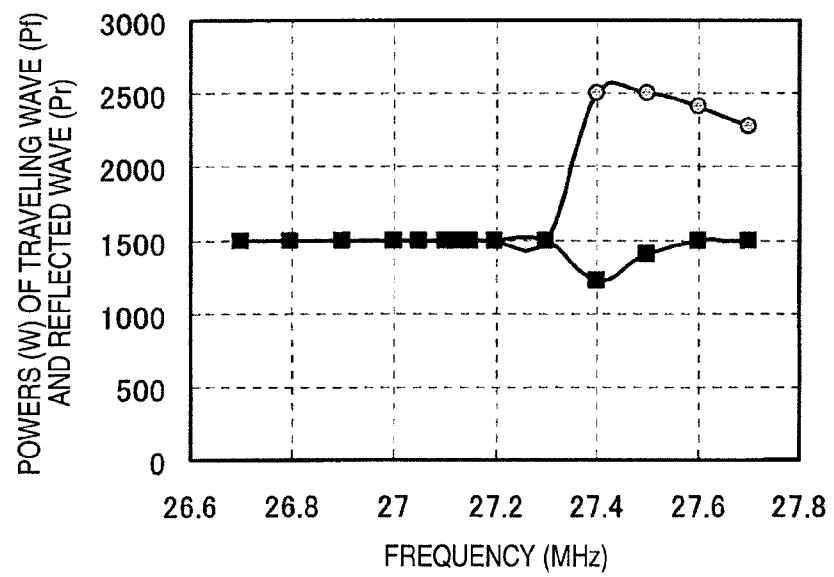
FIG. 8 is a reflected wave map in the prior art.
FIG. 9 shows the discharge frequency dependence of traveling wave Pf and reflected wave Pr in a case where frequency is raised from the lower frequency side and where a feeding point and a ground point are appropriate.

As described previously, in the techniques set forth in JP-A-2000-49000 and JP-A-2003-37101, it has been difficult to cope with various conditions in which the electric discharge pressure or electric discharge power is varied as shown in FIG. 8. In contrast, in the plasma processing apparatus according to the present invention, it is possible to cope with a wide range of conditions by appropriately adjusting the static capacitance of the variable capacitive device 31.

FIG. 2A shows the results of a reflected wave map obtained using the present invention under the same electric discharge conditions as in FIG. 8. FIG. 2B shows a map of capacitance values of the variable capacitive device 31 at this time. As can be seen from FIG. 2A, reflected wave Pr=0 W under all the conditions. Furthermore, it can be seen from FIG. 2B that it is appropriate to use greater static capacitances under conditions of 533 Pa and 1000 W where the reflected wave was large in FIG. 8 and under conditions of 100 Pa and 4500 W. FIG. 2B shows only the results using $O_2$ gas. It has been confirmed that even when other gas systems, i.e., mixture gas systems such as $H_2/N_2$ system, $H_2/He$ system, and $N_2/CF_4$ system are used, reflected wave maps in which the electric discharge pressure and electric discharge power are varied in a matrix manner are obtained and that reflected wave Pr=0 W under all conditions executed.

Figure 3:
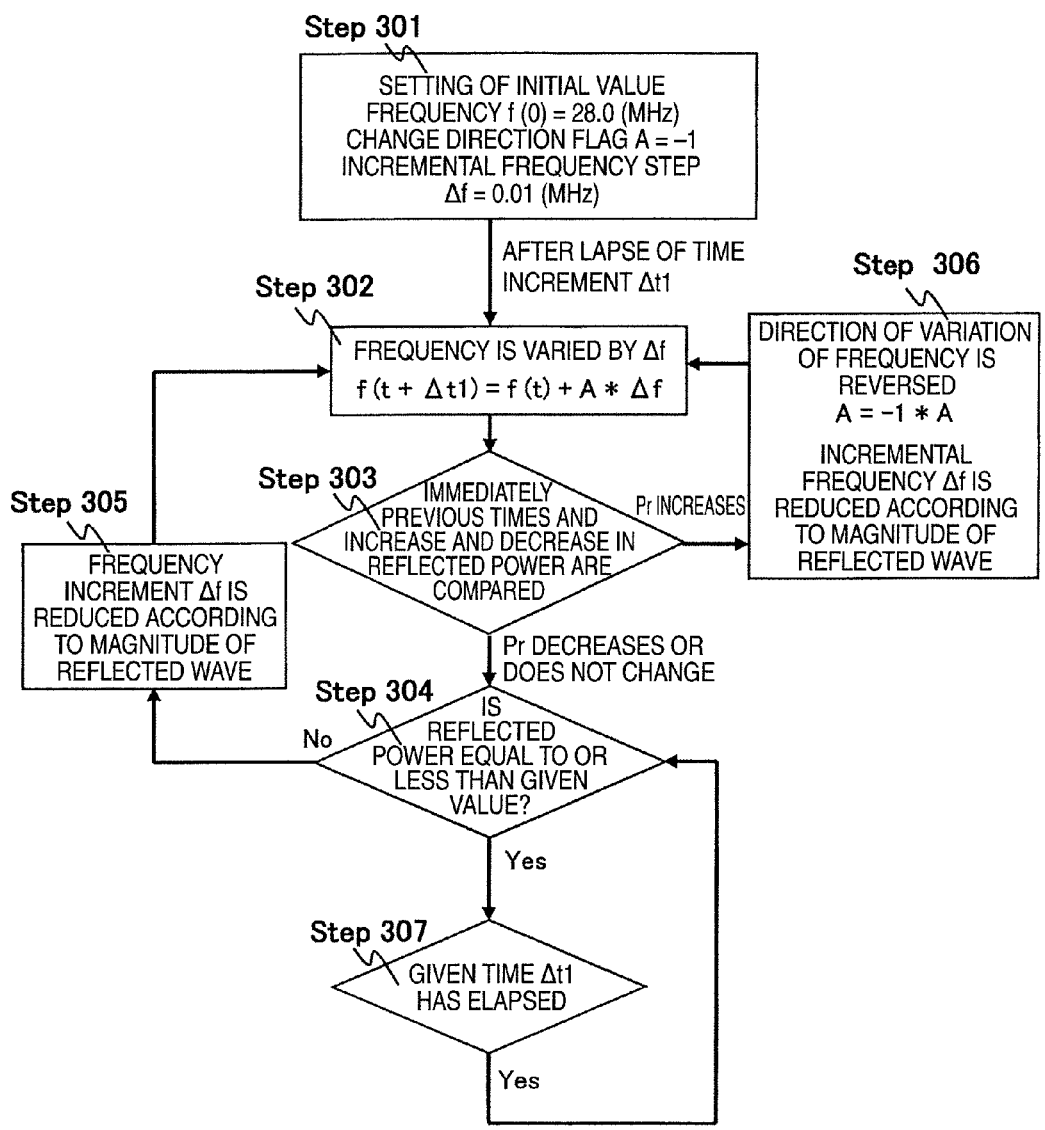
FIG. 3 is a block diagram showing one example of algorithm by which frequency is automatically adjusted.

One example of a simple algorithm for automatically adjusting the frequency is next shown in FIG. 3. Incidentally, variations of incident wave and reflected wave relative to frequency are typically as shown in FIG. 7A.

First, at step 301, the frequency f (0) at which RF electric power is started to be applied, an incremental frequency Δf at which the frequency is varied, a time increment Δt1, and a flag A determining the direction in which the frequency is varied are set. Where the central frequency of the RF power supply is 27.12 MHz, typical settings are f (0)=28.0 MHz, Δf=0.01 MHz, Δt1=approximately 5 ms, and A=−1 (in the direction in which the frequency is lowered).

Figure 7A:
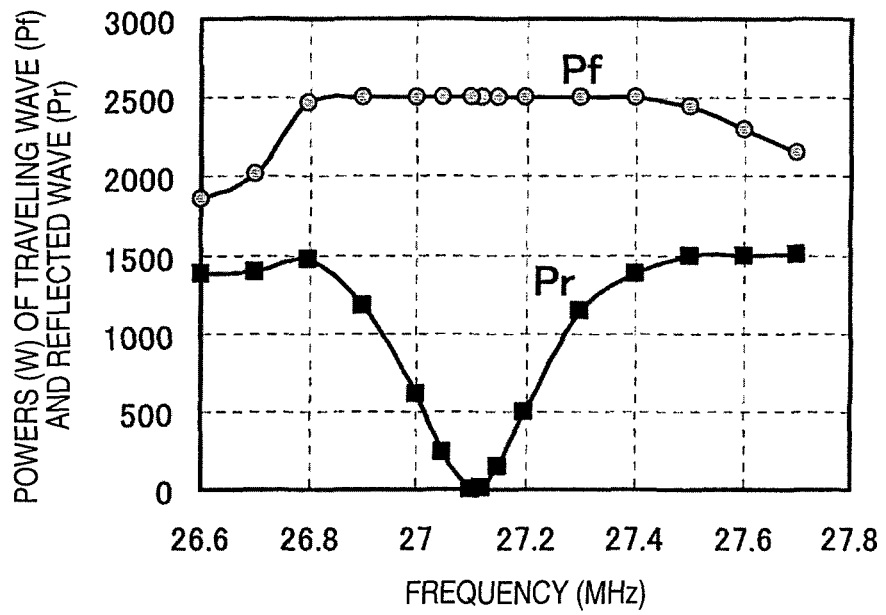
FIG. 7A shows the electric discharge frequency dependence of traveling wave Pf and reflected wave Pr in a case where a feeding point and a ground point are appropriate.
Figure 7B:
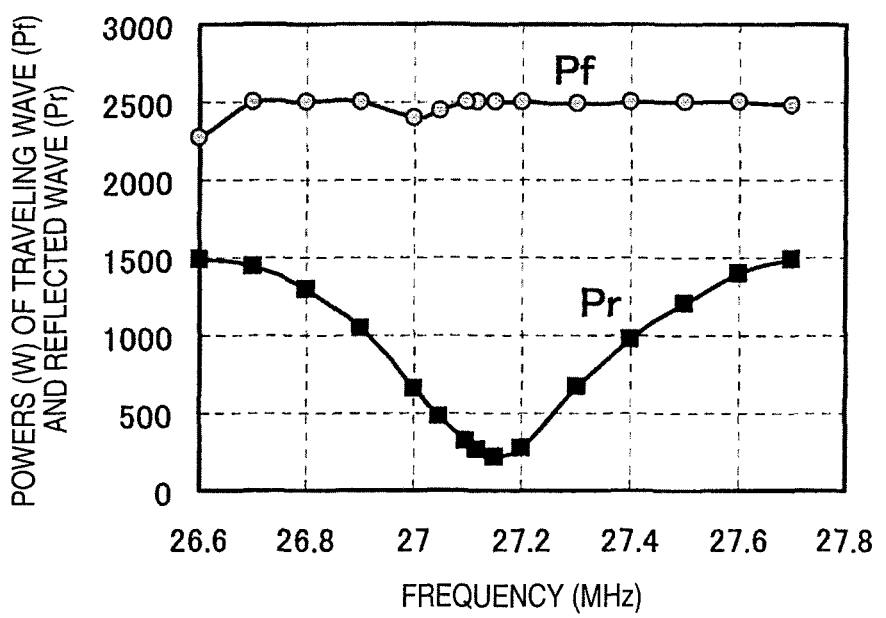
FIG. 7B shows the electric discharge frequency dependence of traveling wave Pf and reflected wave Pr in a case where the feeding point and the ground point are inappropriate.

If the frequency is lowered in steps by executing steps 302 to 305, the reflected wave Pr decreases in increments as can be seen from FIG. 7A but the traveling wave Pf increases in increments for the following reason. The resonant frequency of the helical resonator is set close to 27.12 MHz. The frequency f (0) at which the RF power is started to be applied is 28.6 MHz, which is a value slightly higher than 27.12 MHz. As Pf increases and Pr decreases, a plasma begins to be produced at any timing. (It is estimated from FIG. 7A that it is probably approximately 27.7 MHz to 27.6 MHz.)

Where the value of the reflected wave has decreased to some extent, processing for reducing the incremental frequency Δf is performed (step 305). Furthermore, where the reflected wave is increased by excessively lowering the frequency, processing is made to go from step 303 to step 306, and the sense of the frequency variation is varied. Where the value of the reflected wave has decreased below a given value, processing proceeds to a loop of steps 304 and 307. The frequency is not varied unless the reflected wave is increased again beyond the given value by some effect or other.

FIG. 3 merely shows one example of algorithm for automatically adjusting the frequency. Other algorithms may also be used. Furthermore, the starting frequency f (0), incremental frequency Δf, and time increment Δt1 are merely exemplary and other values may also be used. When the frequency is automatically controlled, the frequency f (0) at which RF electric power is started to be applied is preferably made high (for example, 28.0 MHz) compared with the frequency (approximately 27.12 MHz) at which the reflected wave decreases to a minimum finally such that control is started in a direction in which the frequency is lowered.

FIG. 9 shows traveling wave power (Pf) and reflected wave power (Pr) in a case where the frequency of the RF power supply is varied in a helical resonator in which the feeding point and the ground point are adjusted in position appropriately. When the present data was collected experimentally, the oscillation frequency of the RF power supply was set manually. The frequency was varied in steps from the lower-frequency side (26.7 MHz) to the higher-frequency side (27.7 MHz). That is, in this case, the direction in which the frequency is varied is reversed to the case of FIG. 7A.

It can be seen from this figure that a totally reflected state is kept from 26.7 MHz to 27.3 MHz (Pf=Pr=1500 W) and that no plasma is produced at all. Pf increased but Pr decreased at 27.4 MHz and so it can be seen that a plasma was generated at this frequency. However, as the frequency was increased further, Pf decreased but Pr increased and, therefore, the control was totally reversed in direction. In the automatic control algorithm shown in FIG. 3, the sense in which the frequency is varied is reversed into the decreasing direction and so there is no great problem. It can be observed that the control is preferably started in the direction in which the frequency is lowered from the point of view of matching speed and from the point of view of elimination of wasteful frequency sweeping.

Figure 4:
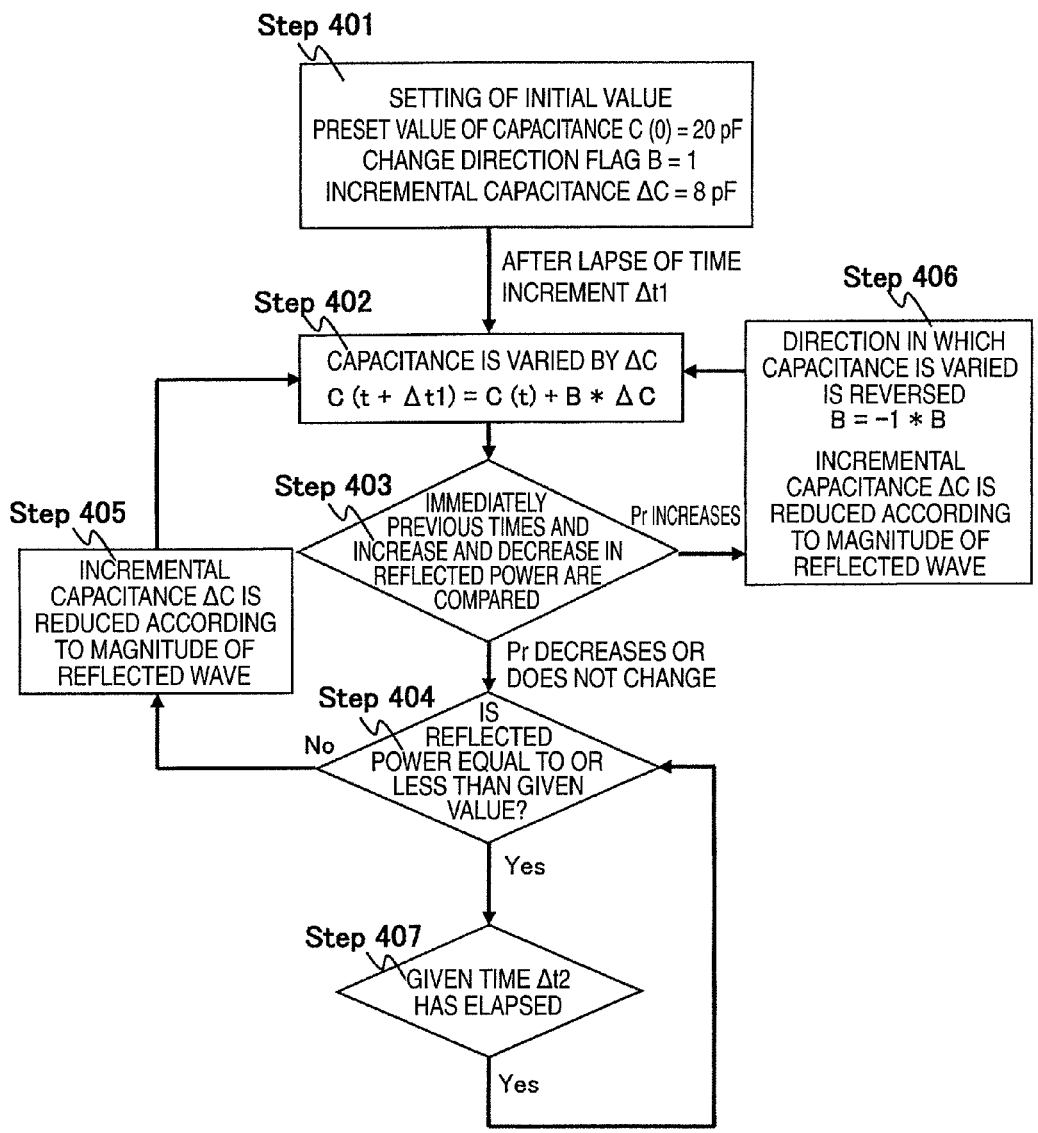
FIG. 4 is a block diagram showing one example of algorithm by which the capacitance of a variable capacitive device is automatically adjusted.

One example of a simple algorithm for automatically adjusting the static capacitance C of a variable capacitive device is next shown in FIG. 4. In this figure, at step 401, an initial capacitance C (0) at which RF power is started to be applied, an incremental capacitance ΔC at which the capacitance is varied, a time increment Δt2, and a flag B determining the direction in which the capacitance is varied are first set.

Typically, settings C=20 pF, ΔC=8 pF, Δt1=approximately 50 ms, and B=1 (in the direction in which the capacitance is increased) are made. An appropriate value of the initial capacitance C (0) can be entered as a preset value from a process recipe.

Then, the capacitance is increased in steps by executing steps 402 to 405. Where the value of the reflected wave has decreased to some extent, processing for reducing the incremental capacitance AC is performed (step 405). Where the reflected wave has increased by increasing the capacitance excessively, processing goes from step 403 to step 406, and the sense in which the capacitance is varied is changed.

Where the value of the reflected wave has decreased below a given value, processing proceeds to a loop of steps 404 and 407, where the capacitance is not varied unless the reflected wave again increases beyond the given value by some effect or other. FIG. 4 shows merely one example of algorithm for automatically adjusting the static capacitance of the variable capacitive device. Other algorithms may also be used. Furthermore, the initial capacitance C (0), incremental capacitance ΔC, and time increment Δt2 are merely exemplary, and other values may also be used. Additionally, by using the automatic frequency control method shown in FIG. 3 and the method of automatically controlling the static capacitance of the variable capacitive device as shown in FIG. 4 in combination, the reflected wave Pr can be automatically suppressed below the given value at all times.

Figure 5:
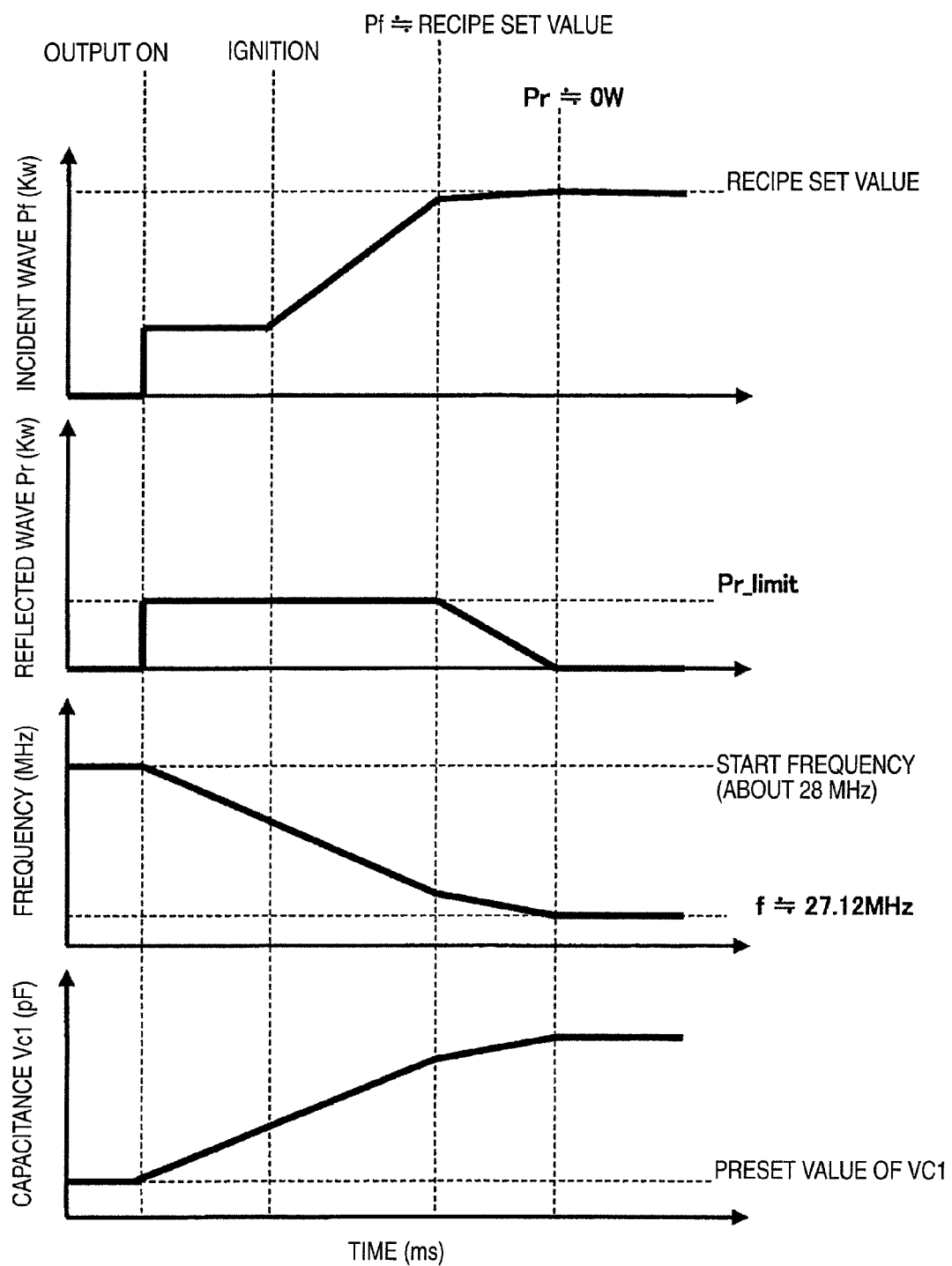
FIG. 5 is a schematic diagram showing a plasma ignition sequence according to the present invention.
Figure 6:
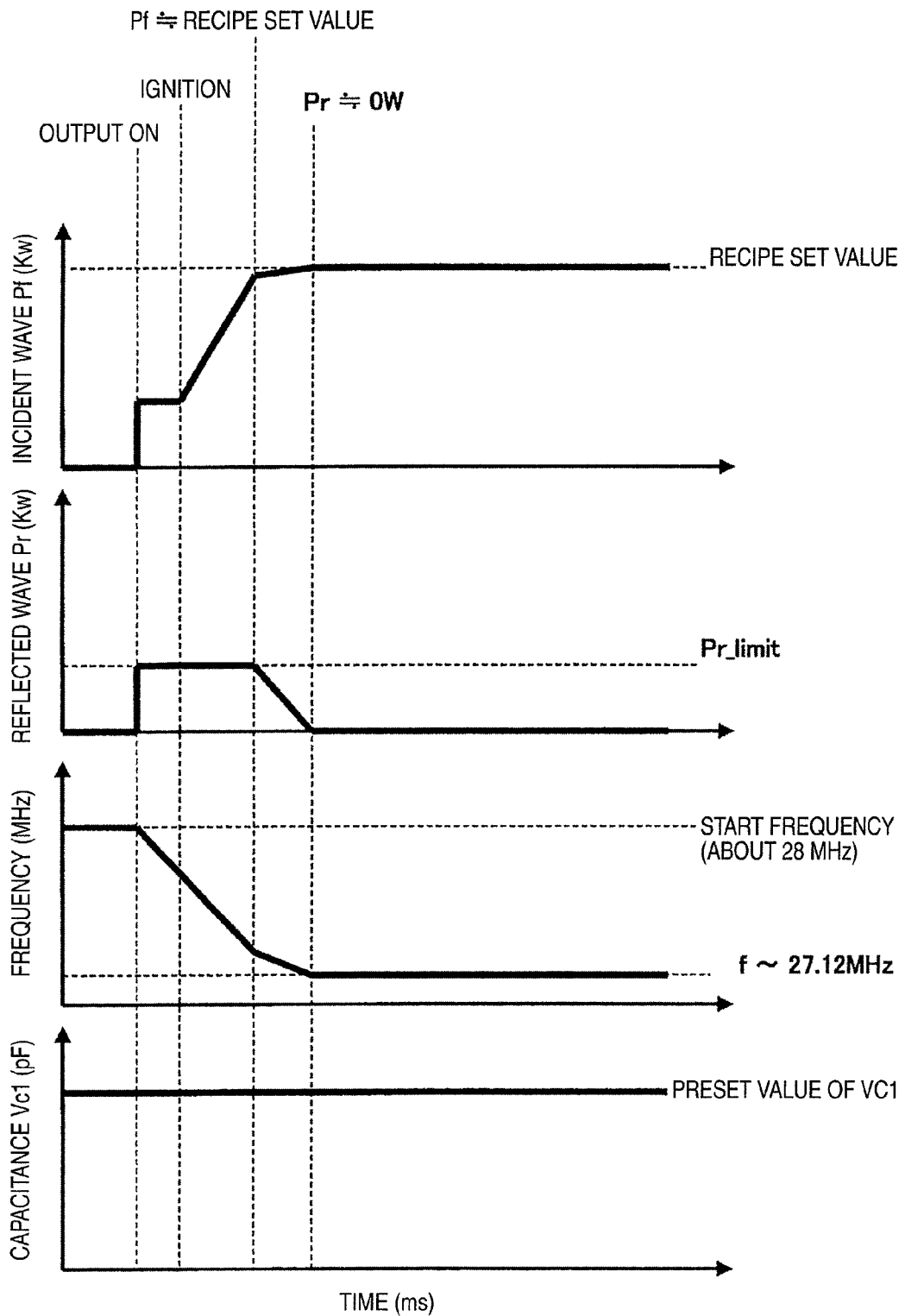
FIG. 6 is a schematic diagram showing an ignition sequence used where the preset value of the variable capacitive device has been adjusted appropriately.

FIGS. 5 and 6 show schematic diagrams (electric discharge sequences) in which the incident wave Pf (t), reflected wave Pr (t), frequency (t), and the static capacitance C (t) of a variable capacitive device VC1 vary with time from the instant when the output of RF power is turned on to the instant when Pr=0 W. FIG. 5 shows a case in which the preset value C (0) of the capacitance VC1 was lower than an optimum value. FIG. 6 shows a case in which the present value of VC1 was appropriate.

In any figure, the incident wave increases and the reflected wave decreases according to variations in the values of the frequency and VC1. The totally reflected state is maintained until a plasma is generated (ignited). The incident wave Pf and the reflected wave Pr have the substantially same value of Pr_limit. In a general RF power supply for plasma, output feedback control is provided such that the Pf assumes a set value under the condition where a plasma is generated. When no plasma is generated and a totally reflected state occurs, the apparatus has a function of preventing damage to the power supply by suppressing the value of the output Pf to a certain value (Pr_limit).

Immediately after generation (ignition) of a plasma, the reflected wave Pr is kept constant at Pr_limit and Pf increases. After Pf has reached the recipe set value, the value of Pr decreases and the matching is completed when Pr=0 W. The time from the instant when the output is turned on to completion of matching can be reduced greatly by appropriately setting the preset value of VC1 as shown in FIG. 6. That is, from the ignition to the matching can be controlled using only the frequency without moving the VC1 at all.

In a general matching device having no frequency matching function, two variable capacitive devices (VC1, VC2) are used. Generally, the positions of the VC1 and VC2 at which a plasma is generated are different from the positions of the VC1 and VC2 when Pr=after the generation of the plasma. Accordingly, it is necessary to mechanically drive the VC1 and VC2 during the interval from the ignition to the matching. Where a value giving Pr=0 W is set from the beginning as the preset values of the VC1 and VC2, no plasma might be produced.

In any case, the need to drive the variable capacitive devices by mechanical units arises. Therefore, it has been unavoidable that some time is taken from ignition to matching. In contrast, in the present invention, from ignition to matching can be controlled only using the frequency without moving the VC1 at all by appropriately setting the preset value of the VC1.

That is, there is the prospect of much higher speeds compared with conventional matching devices having no frequency matching function. Furthermore, in the case where only a frequency matching device is used as set forth in JP-A-2000-49000 and JP-A-2003-37101, there is the prospect of higher speeds of matching operation but there is the disadvantage that the matching range is narrow as shown in FIG. 8 and a considerable amount of reflected wave is left depending on the condition. In contrast, use of the present invention makes it possible to greatly extend the matching range as shown in FIG. 2. In addition, a greatly increased high speed of the matching operation from ignition can also be achieved at the same time.

Furthermore, a matching unit is obtained by mounting a variable capacitive device in close proximity to the feeding point of a helical antenna of a plasma processing apparatus having a helical resonator equipped with a frequency matching unit as shown in the present invention. Since there is only one variable capacitive device, the matching device can be fabricated in much smaller size and at lower cost than normal matching devices of two or more elements. Further, RF power loss in the matching unit is reduced because there are few devices, needless to say.

The above description has been provided regarding embodiments. The present invention is not restricted thereto. It is obvious for those skilled in the art that various changes and modifications are possible within the spirit of the present invention and the scope of the accompanying claims.

The invention claimed is:

1. A plasma processing apparatus comprising:
   an evacuable vacuum vessel;
   a processing chamber disposed inside the vacuum vessel and having an inside space in which a sample to be processed is placed and in which a plasma for processing is generated;
   a unit for supplying a gas for plasma generation into the processing chamber;
   a vacuum evacuation unit for evacuating the inside of the processing chamber;
   a helical resonator configured of a helical resonance coil disposed outside the vacuum vessel and an electrically grounded shield disposed outside the coil;
   an RF power supply of a variable frequency for supplying RF electric power in a given range to the resonance coil; and
   a frequency matching device capable of adjusting the frequency of the RF power supply so as to minimize reflected RF electric power;
   wherein said resonance coil has an electrical length that is set to an integral multiple of one wavelength at said given frequency; and
   wherein said helical resonance coil has a feeding point connected to ground potential using a variable capacitive device.

2. The plasma processing apparatus set forth in claim 1, wherein there is further provided a stationary inductive device connected in parallel with said variable capacitive device.

3. The plasma processing apparatus set forth in claim 1, wherein the apparatus includes means for making an automatic adjustment of the capacitance of said variable capacitive device such that reflected RF electric power is minimized.

* * * * *